US010010012B2

(12) United States Patent
Yoo et al.

(10) Patent No.: US 10,010,012 B2
(45) Date of Patent: Jun. 26, 2018

(54) SHIELD CAN ASSEMBLY AND ELECTRONIC DEVICE HAVING THE SAME

(71) Applicant: Samsung Electronics Co., Ltd., Gyeonggi-do (KR)

(72) Inventors: Kyung-Ho Yoo, Gyeonggi-do (KR); Jeong-Nam Cheon, Gyeonggi-do (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 34 days.

(21) Appl. No.: 14/671,924

(22) Filed: Mar. 27, 2015

(65) Prior Publication Data

US 2015/0282387 A1 Oct. 1, 2015
US 2017/0251569 A9 Aug. 31, 2017

(30) Foreign Application Priority Data

Mar. 27, 2014 (KR) .................. 10-2014-0035941

(51) Int. Cl.
| H05K 7/20 | (2006.01) |
| H05K 9/00 | (2006.01) |
| H05K 1/02 | (2006.01) |
| H05K 7/02 | (2006.01) |

(52) U.S. Cl.
CPC ....... *H05K 7/20336* (2013.01); *H05K 1/0203* (2013.01); *H05K 7/02* (2013.01); *H05K 9/0084* (2013.01)

(58) Field of Classification Search
CPC ............. H05K 7/20336; H05K 1/0203; H05K 7/20809; H05K 7/2099; H05K 7/20963; H05K 2201/064; H05K 7/20154; H05K 7/2039; H05K 7/209; H05K 9/0026
See application file for complete search history.

(56) References Cited

U.S. PATENT DOCUMENTS

| 7,708,583 | B2* | 5/2010 | Ma | H01L 23/4006 361/711 |
| 2002/0064027 | A1* | 5/2002 | Sasaki | G06F 1/203 361/700 |
| 2002/0067598 | A1* | 6/2002 | Sathe | H01L 23/4006 361/700 |
| 2003/0193794 | A1* | 10/2003 | Reis | H01L 23/552 361/816 |
| 2004/0200632 | A1 | 10/2004 | Kanai | |
| 2008/0259566 | A1* | 10/2008 | Fried | F28D 15/0266 361/699 |
| 2010/0300739 | A1* | 12/2010 | Suzuki | G06F 1/183 174/260 |
| 2011/0310315 | A1* | 12/2011 | Yamaguchi | G06F 1/203 348/836 |
| 2011/0310561 | A1* | 12/2011 | Hata | G06F 1/203 361/697 |

(Continued)

FOREIGN PATENT DOCUMENTS

| JP | 2004297031 A | 10/2004 |
| KR | 10-2008-0082744 | 9/2008 |
| KR | 20120103261 A | 9/2012 |

*Primary Examiner* — Adam B Dravininkas

(57) ABSTRACT

An electronic device is provided. The electronic device includes a printed circuit board, at least one electronic component disposed on the printed circuit board, a shield can disposed on the printed circuit board to shield the at least one electronic component, and at least one heat pipe disposed adjacent to at least a part of the shield can.

16 Claims, 8 Drawing Sheets

(56) References Cited

U.S. PATENT DOCUMENTS

2012/0069522 A1\* 3/2012 Hung ..................... H01L 23/34
                                                              361/700
2012/0229726 A1   9/2012 Kim
2014/0092559 A1\* 4/2014 Yamaguchi ........ H05K 7/20336
                                                              361/700

\* cited by examiner

SHIELD CAN ASSEMBLY AND ELECTRONIC DEVICE HAVING THE SAME

CROSS-REFERENCE TO RELATED APPLICATION

The present application is related to and claims the benefit under 35 U.S.C. § 119(a) of a Korean patent application Serial No. 10-2014-0035941 filed in the Korean Intellectual Property Office on Mar. 27, 2014, the entire disclosure of which is hereby incorporated by reference.

TECHNICAL FIELD

The present disclosure relates to a shield can assembly, and more particularly, to an electronic device having the shield can assembly.

BACKGROUND

An electronic device is provided with a Printed Circuit Board (PCB)as a main board,which is formed in various shapes. On the PCB, various electronic components (electronic function groups) is mounted so as to execute various functions of the electronic device. The electronic components may generate various harmful radio waves (e.g., electromagnetic waves). In addition, as the electronic device is provided with high performance electronic components, the surface temperature of the electronic device increases due to the heat generated by the electronic components.

A method of coating paint on a PCB by EMI spraying or vacuum deposition, or a method of mounting one or more shield cans in order to shield one or more electronic components mounted on the PCB, has been mainly used in order to shield the harmful radio waves described above. In addition, for example, a heat sink, a heat dissipation pad, or a heat dissipation sheet has been applied to an electronic component mounted on the PCB in order to dissipate the heat generated from the electronic component.

SUMMARY

Even if a shield can is used in the electronic device to shield electromagnetic waves generated from an electronic component mounted on a PCB, heat generated from the electronic component may not be smoothly dissipated to the surface of the shield can. For example, when a heat sink is applied to an electronic component so as to dissipate heat generated from the electronic component, the entire volume of the electronic device should increase. When a heat dissipation pad or a heat dissipation sheet is applied to an electronic component, only a limited heat dissipation effect of about 2° C. may be obtained after the application.

To address the above-discussed deficiencies, it is a primary object to provide a shield can assembly capable of executing both an electromagnetic wave shield action and a heat dissipation action.

Another aspect of the present disclosure is to provide a shield can assembly capable of efficiently executing heat dissipation without increasing the volume of an electronic device.

Another aspect of the present disclosure is to provide a shield can assembly capable of improving space usability of a PCB and reducing a surface temperature of an electronic device so as to improve the use environment of the electronic device.

In accordance with an aspect of the present disclosure, an electronic device is provided. The electronic device includes a printed circuit board, at least one electronic component mounted on the printed circuit board, a shield can disposed on the printed circuit board to shield the at least one electronic component, and at least one heat pipe installed adjacent to at least a part of the shield can.

In accordance with another aspect of the present disclosure, a shield can is provided. The shield can includes a top surface, a side surface bent in a predetermined height along a border of the top surface, and at least one heat pipe installed adjacent to at least one of the top surface and the side surface.

According to various embodiments, a shield can assembly and an electronic device having the same are capable of executing both an electromagnetic wave shield action and a heat dissipation action. According to various embodiments, a shield can assembly and an electronic device having the same are capable of efficiently executing heat dissipation without increasing the volume of the electronic device. According to various embodiments, a shield can assembly and an electronic device having the same are capable of improving space usability of a PCB and reducing a surface temperature of an electronic device, thereby improving a use environment of the electronic device.

Before undertaking the DETAILED DESCRIPTION below, it may be advantageous to set forth definitions of certain words and phrases used throughout this patent document: the tends "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

The same reference numerals are used to represent the same elements throughout the drawings.

DETAILED DESCRIPTION

Figure 1:
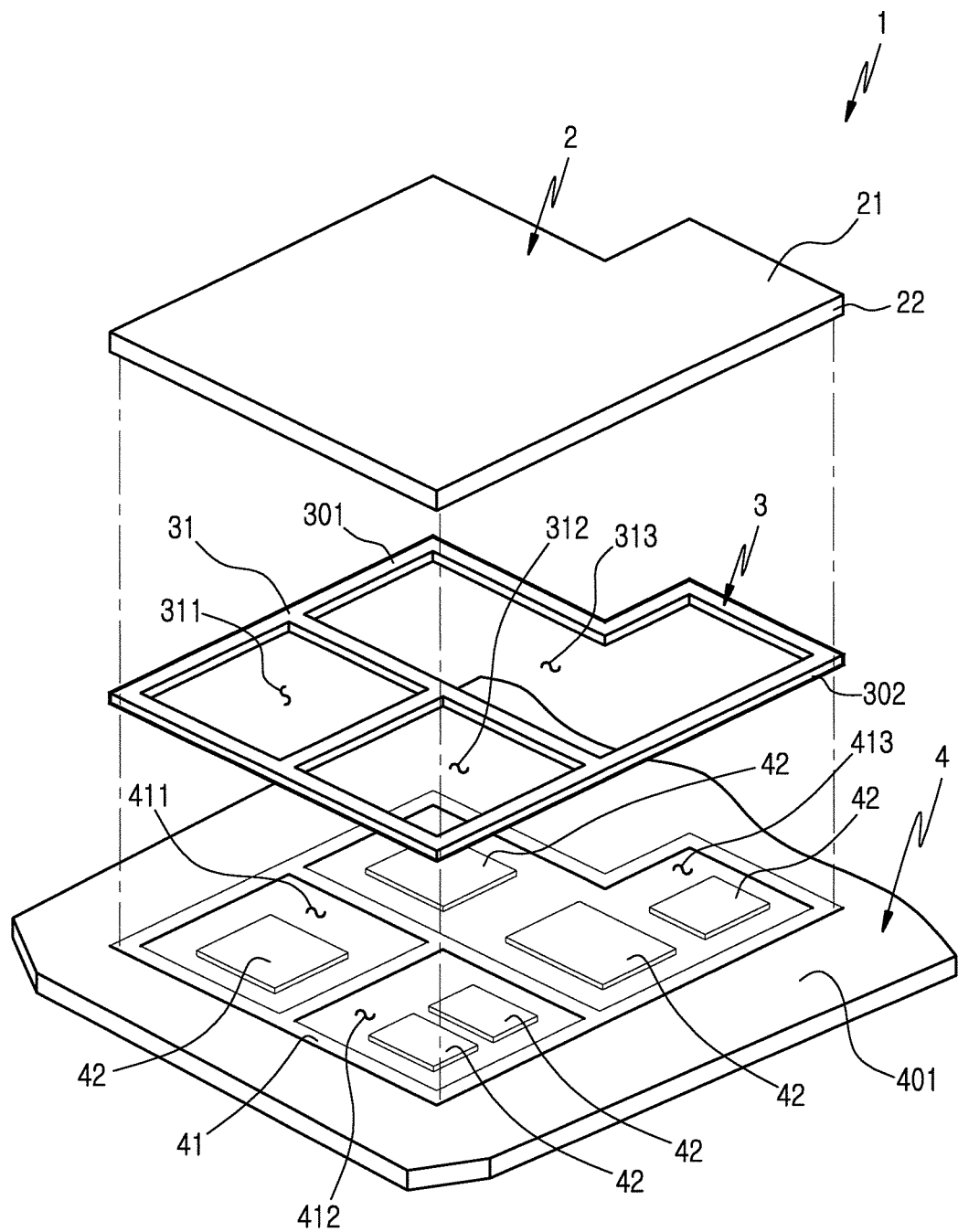
FIG. 1 illustrates a perspective view of a shield can assembly in a disassembled state according to various embodiments of the present disclosure.

FIGS. 1 through 8, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged electronic device or system. The following description with reference to the accompanying drawings is provided to assist in a comprehensive understanding of various embodiments of the present disclosure as defined by the claims and their equivalents. The present disclosure can be modified in various forms and include various embodiments, but specific examples are illustrated in the drawings and described in the description. However, the description is not intended to limit the present disclosure to the specific embodiments, and it shall be appreciated that all the changes, equivalents and substitutions belonging to the idea and technical scope of the present disclosure are included in the present disclosure.

The term "include" or "may include" or "can include" refers to the existence of a corresponding disclosed function, operation or component which can be used in various embodiments of the present disclosure and does not limit one or more additional functions, operations, or components. Further, as used in embodiment of the present disclosure, the terms "include", "have" and their conjugates may be construed to denote a certain characteristic, number, step, operation, constituent element, component or a combination thereof, but may not be construed to exclude the existence of or a possibility of addition of one or more other characteristics, numbers, steps, operations, constituent elements, components or combinations thereof.

The term "or" used in various embodiments of the present disclosure includes any or all of combinations of listed words. For example, the expression "A or B" may include A, may include B, or may include both A and B.

The expression "1", "2", "first", or "second" used in various embodiments of the present disclosure can modify various components of various embodiments but does not limit the corresponding components. For example, the above expressions do not limit the sequence and/or importance of the corresponding elements. The above expressions can be used merely for the purpose of distinguishing one element from the other elements. For example, a first electronic device and a second electronic device indicate different electronic devices although both of them are electronic devices. For example, without departing from the scope of the present disclosure, a first component element can be named a second component element. Similarly, the second component element also can be named the first component element.

When an element is referred to as being "coupled" or "connected" to any other element, it should be understood that not only the element can be directly coupled or connected to the other element, but also a third element can be interposed therebetween. In contrast, when an element is referred to as being "directly coupled" or "directly connected" to any other element, it should be understood that no element is interposed therebetween.

In the present disclosure, the terms are used to describe a specific embodiment, and are not intended to limit the present disclosure. As used herein, the singular forms are intended to include the plural forms as well, unless the context clearly indicates otherwise.

Unless defined differently, all terms used herein, which include technical terminologies or scientific terminologies, have the same meaning as a person skilled in the art to which the present disclosure belongs. Such terms as those defined in a generally used dictionary are to be interpreted to have the meanings equal to the contextual meanings in the relevant field of art, and are not to be interpreted to have ideal or excessively formal meanings unless clearly defined in the present disclosure.

An electronic device according to various embodiments of the present disclosure includes a substrate in which a plurality of electronic parts can be mounted. For example, the electronic device can include at least one of a smart phone, a tablet Personal Computer (PC), a mobile phone, a video phone, an e-book reader, a desktop PC, a laptop PC, a netbook computer, a PDA, a Portable Multimedia Player (PMP), an MP3 player, a mobile medical device, a camera, a wearable device (for example, a Head-Mounted-Device (HMD) such as electronic glasses, electronic clothes, an electronic bracelet, an electronic necklace, an electronic appcessory, an electronic tattoo, and a smart watch.

According to some embodiments, the electronic device can be a smart home appliance. The smart home appliance as an example of the electronic device includes at least one of, for example, a television, a Digital Video Disk (DVD) player, an audio system, a refrigerator, an air conditioner, a vacuum cleaner, an oven, a microwave oven, a washing machine, an air cleaner, a set-top box, a TV box (e.g., SAMSUNG HOMESYNC™, APPLE TV®, or GOOGLE TV®), a game console, an electronic dictionary, an electronic key, a camcorder, and an electronic picture frame.

According to some embodiments, the electronic device includes at least one of various types of medical devices (for example, Magnetic Resonance Angiography (MRA), Magnetic Resonance Imaging (MRI), Computed Tomography (CT), a scanning machine, ultrasonic wave device and the like), a navigation device, a Global Positioning System (GPS) receiver, an Event Data Recorder (EDR), a Flight Data Recorder (FDR), a car infotainment device, ship electronic equipment (for example, navigation equipment for a ship, a gyro compass and the like), avionics, a security device, and an industrial or home robot.

According to another embodiment, the electronic devices includes at least one of furniture or a part of a building/structure having a communication function, electronic boards, electronic signature receiving devices, projectors, or various measuring equipment (such as, equipment for a water supply, an electricity, gases or radio waves).

An electronic device according to various embodiments of the present disclosure can be a combination of one or more of above described various devices. Also, an electronic device according to various embodiments of the present disclosure can be a flexible device. Also, an electronic device according to various embodiments of the present disclosure is not limited to the above described devices.

According to various embodiments of the present disclosure, a Printed Circuit Board (PCB) can be a rigid type. Without being limited thereto, however, the PCB can be a flexible type. For example, even if a PCB is not applied to the interior of an electronic device, it is apparent that the technical idea of the present disclosure is applicable when a shield can for shielding an electronic component is applied.

FIG. 1 illustrates a perspective view of a shield can assembly according to various embodiments of the present disclosure in a disassembled state.

Referring to FIG. 1, a shield can assembly 1 includes a PCB 4 having a ground pad 41, a shield can 2 installed to be electronically connected with the ground pad 41 so as to shield harmful radio waves generated from a plurality of electronic components 42 mounted on the PCB 4, and a heat pipe 3 installed adjacent to the shield can 2 so as to dissipate heat generated from the electronic components 42 mounted on the PCB 4.

According to one embodiment, the ground pad 41 formed or installed on the PCB 4 can be arranged on the top surface 401 of the PCB 4 to be exposed, and electrically connected to a ground of the PCB 4. For example, the ground pad 41 includes a ground line or an Electro-Magnetic Interference (EMI) gasket provided on the PCB 4. The ground pad 41 forms closed regions that correspond to borders of the heat pipe 3, respectively. According to one embodiment, the ground pad 41 includes a first region 411 that accommodates a plurality of electronic components 42 and is formed in a predetermined closed shape, a second region 412 that accommodates a plurality of electronic components 42 and is formed in a predetermined closed shape, and a third region 413 that accommodates a plurality of electronic components 42 and is formed in a predetermined closed shape.

According to one embodiment, the heat pipe 3 is fixed to shield the first region 411, the second region 412, and the third region 413 of the PCB 4. According to one embodiment, a frame 31 of the heat pipe 3 is fixed in a state where it is electrically connected with the ground pad 41 of the PCB, which forms the first region 411, the second region 412, and the third region 413. According to one embodiment, the frame 31 of the heat pipe 3 is installed to be stacked on the top of the ground pad 41 disposed on the PCB 4. Without being limited thereto, however, the frame 31 is installed to be fixed with the shield can 2 without being in contact with the ground pad 41.

According to one embodiment, the heat pipe 3 includes a top surface 301 formed in a size that is at least equal to that of the ground pad 41, and a side surface 302 formed by being bent along the borders of the top surface 301 so as to provide a predetermined height. Accordingly, the spaces 311, 312 and 313 formed by the top surface 301 and the side surfaces 302 having the predetermined height is applied as accommodation spaces capable of accommodating the electronic components 42 when the heat pipe 3 is fixed to the PCB 4. For example, the first space 311, the second space 312, and the third space 313 formed as describe above can correspond to the first region 411, the second region 412, and the third region 413 of the PCB 4.

According to one embodiment, the heat pipe 3 is formed in a hollow structure using a metallic material such as steel use stainless (SUS), copper or aluminum. According to one embodiment, the hollow portion of the heat pipe 3 is filled with a volatile coolant so as to cool heat generated from the electronic components 42 mounted on the PCB 4. For example, the heat generated from the electronic components 42 mounted on the PCB 4 can be transferred to the shield can 2 and the heat transferred to the shield can 2 can be transferred to the heat pipe 3. According to one embodiment, the heat pipe 3 dissipates the transferred heat in a circulating manner.

According to various embodiments, the heat pipe 3 is formed in a pipe structure having a rectangular cross section. Without being limited thereto, however, the heat pipe 3 is formed in a pipe structure having a circular or polygonal cross section.

According to one embodiment, the heat pipe 3 is fixed to be in close contact with the shield can 2. According to one embodiment, the heat pipe 3 is adhered to the shield can 2 using at least one of welding, fusion, bonding and a conductive tape. According to one embodiment, when the heat pipe 3 is installed below the shield can 2, the side surface 302 of the heat pipe 3 and the side surface 22 of the shield can 2 extend without any step.

According to one embodiment, the shield can 2 is fixed to shield the first region 411, the second region 412, and the third region 413 of the PCB 4. According to one embodiment, the shield can 2 is fixed to be electrically connected with the ground pad 41 of the PCB 4, which forms the first region 411, the second region 412, and the third region 413. According to one embodiment, the shield can 2 is installed to be stacked on the top surface 301 of the heat pipe 3. Without being limited thereto, however, the shield can 2 is installed to be in contact with at least a part of the heat pipe 3.

According to one embodiment, the shield can 2 includes a top surface 21 formed in a size that is at least equal to that of the ground pad 41, and a side surface 22 formed by being bent along the borders of the top surface 21 to provide a predetermined height. Accordingly, the space fowled by the top surface 21 and the side surface 22 having the predetermined height is applied as an accommodation space capable of accommodating the electronic components 42 when the shield can 2 is fixed to the PCB 4. According to one embodiment, the shield can 2 is formed of a conductive metallic material such as SUS or aluminum. In such a case, the top surface 21 and the side surface 22 can be integrally formed through a process, such as pressing or injection molding.

Figure 2:
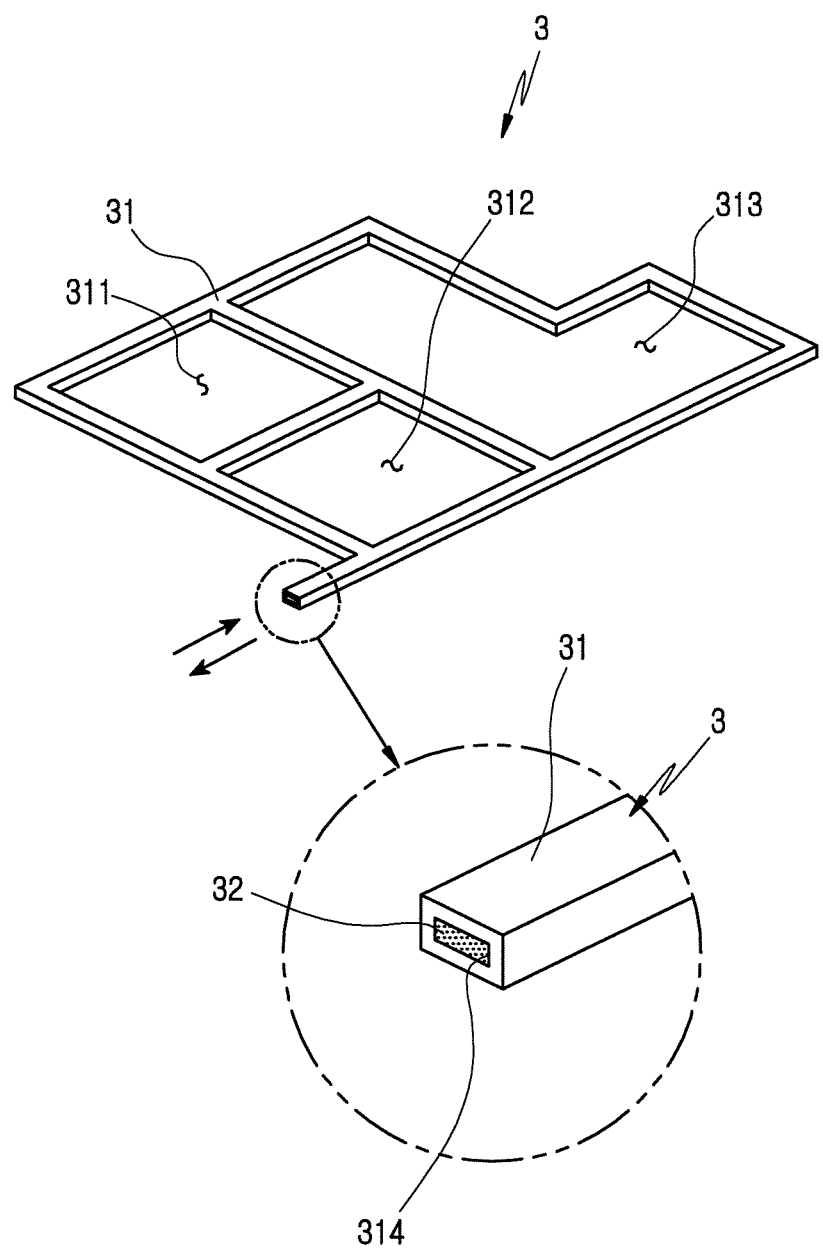
FIG. 2 illustrates a configuration of a heat pipe according to various embodiments of the present disclosure.

FIG. 2 illustrates a configuration of a heat pipe according to various embodiments of the present disclosure.

Referring to FIG. 2, the heat pipe 3 includes a frame 31 that defines a plurality of spaces 311, 312, and 313 for accommodating the electronic components mounted on the PCB. According to one embodiment, the frame 31 is formed in a hollow structure using a metallic material such as SUS, copper or aluminum. According to one embodiment, the hollow portion 314 of the frame 31 is filled with a volatile coolant 32 for cooling the heat generated from the electronic components mounted on the PCB. For example, the heat generated from the electronic components mounted on the PCB can be transferred to the shield can, and the heat transferred to the shield canis transferred to the heat pipe 3. According to one embodiment, the heat pipe 3 dissipates the heat transferred thereto to a discharge port through a vaporization and condensation process of the coolant 32.

According to various embodiments, the heat pipe 3 is formed in a pipe structure having a rectangular cross-section. Without being limited thereto, however, the heat pipe 3 is formed in a pipe structure having a circular or polygonal cross-section. In addition, various types of coolants 32 is filled in the hollow portion 314 of the heat pipe 3.

Figure 3:
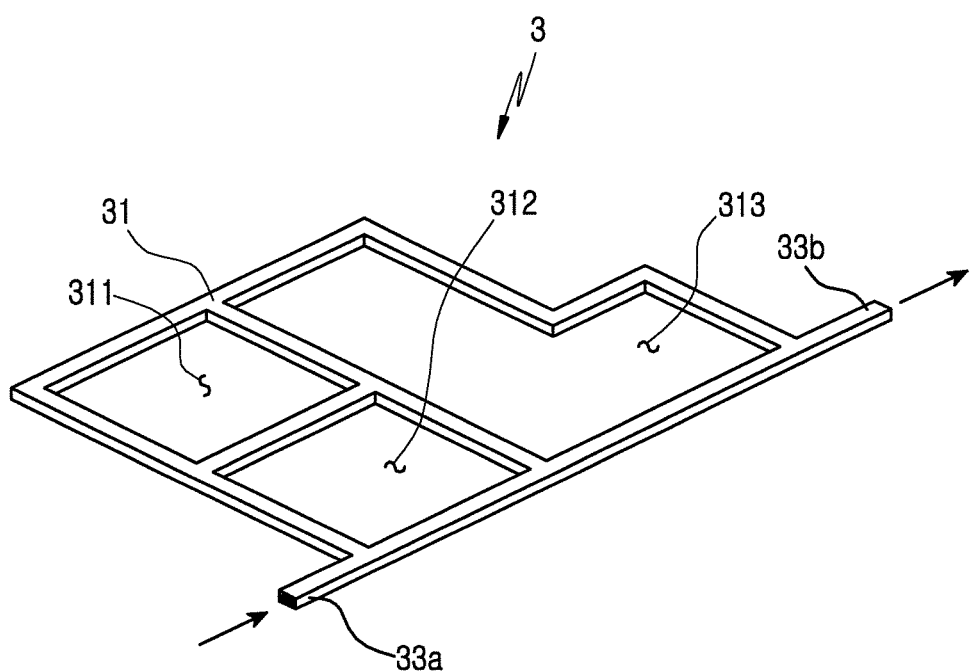
FIG. 3 illustrates a configuration of a heat pipe according to various embodiments of the present disclosure.

FIG. 3 illustrates a configuration of a heat pipe according to various embodiments of the present disclosure.

Referring to FIG. 3, the heat pipe 3 includes a frame 31 that defines a plurality of spaces 311, 312 and 313 for accommodating the electronic components mounted on the PCB. According to one embodiment, the frame 31 is formed in a hollow structure using a metallic material such as SUS, copper, or aluminum. According to one embodiment, the hollow portion of the frame 31 is filled with a volatile coolant 32 for cooling the heat generated from the electronic components mounted on the PCB. For example, the heat generated from the electronic components mounted on the PCB can be transferred to the shield can, and the heat transferred to the shield can is transferred to the heat pipe 3. According to one embodiment, the heat pipe 3 dissipates the heat transferred thereto to a discharge port through a vaporization and condensation process of the coolant 32. According to one embodiment, various types of coolants is introduced into the heat pipe 3 through one introduction port 33a, and the coolant introduced through the introduction port 33a is circulated in the frame 31 to move to a discharge port 33b. Accordingly, the heat absorbed to the heat pipe 3 is dissipated using the circulation method described above.

According to various embodiments, the heat pipe 3 is formed in a pipe structure having a rectangular cross-section. Without being limited thereto, however, the heat pipe 3 is formed in a pipe structure having a circular or polygonal cross-section. In addition, various types of coolants 32 is filled in the hollow portion 314 of the heat pipe 3.

Figure 4:
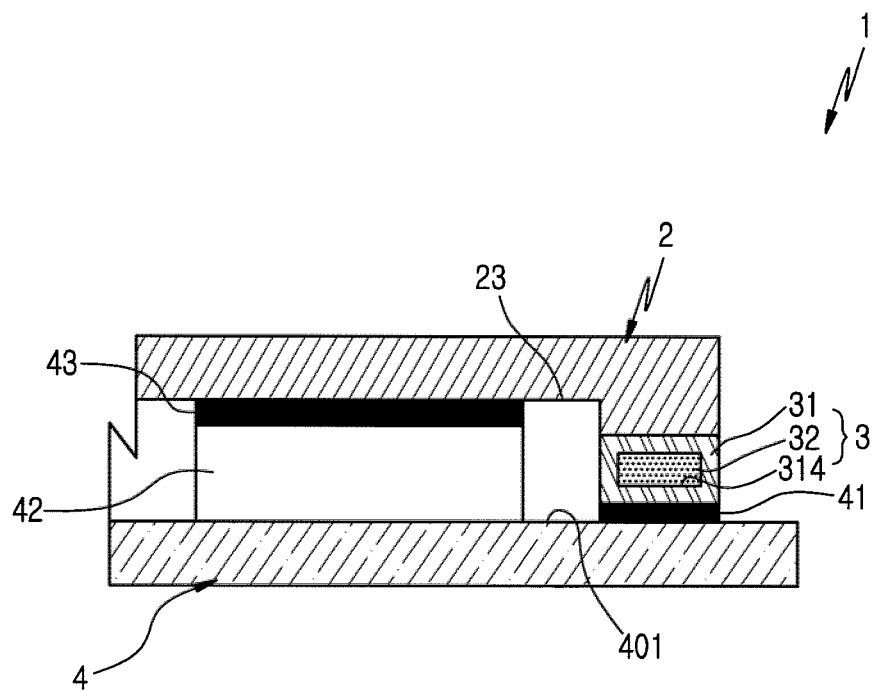
FIG. 4 illustrates a cross-sectional view for describing an assembled state of a shield can assembly according to various embodiments of the present disclosure.

FIG. 4 illustrates a cross-sectional view for describing an assembled state of a shield can assembly according to various embodiments of the present disclosure.

Referring to FIG. 4, a shield can assembly 1 includes a PCB 4 having a ground pad 41, a shield can 2 installed to be electrically connected with the ground pad 41 so as to shield an electronic component 42 mounted on the PCB 4, and a heat pipe 3 installed adjacent to the shield can 2 and dissipating heat generated from the electronic component 42 mounted on the PCB 4.

According to one embodiment, the heat pipe 3 is disposed on the top of the ground pad 41 installed on the top surface 401 of the PCB 4. For example, the heat pipe 3 is interposed between the ground pad 41 and the shield can 2. According to one embodiment, the top portion of the heat pipe 3 is adhered to the shield can 2 using at least one of welding, fusion, bonding, and a conductive tape. According to one embodiment, when the heat pipe 3 is installed below the shield can 2, the heat pipe 3 may serve as a side wall of the shield can 2 to shield the electronic component 42 mounted on the PCB 4.

According to one embodiment, a heat dissipation pad 43 is installed on the top surface of the electronic component 42 of the PCB 4 to absorb the heat generated from the electronic component 42. For example, the heat emitted from the electronic component 42 is transferred to the heat dissipation pad 43 and the shield can 2 and then dissipated by the heat pipe 3. According to one embodiment, the heat dissipation pad 43 is in close contact with an inner surface 23 of the shield can 2 so as to provide the heat absorbed from the electronic component 42 to the shield can 2. Accordingly, the heat generated from the electronic component 42 mounted on the PCB 4 is efficiently transferred to the shield can 2 through the heat dissipation pad 43. According to one embodiment, the heat absorbed from the shield can 2 moves to the frame 31 of the heat pipe 3 having a high heat conductivity, and the coolant 32 hermetically filled in the hollow portion 314 of the frame 31 absorbs and dissipates the heat of the frame 31. According to one embodiment, the coolant 32 that has absorbed the heat of the frame 31 may dissipate the heat to other mechanisms (e.g., a magnesium bracket) through a vaporization and condensation process.

Figure 5:
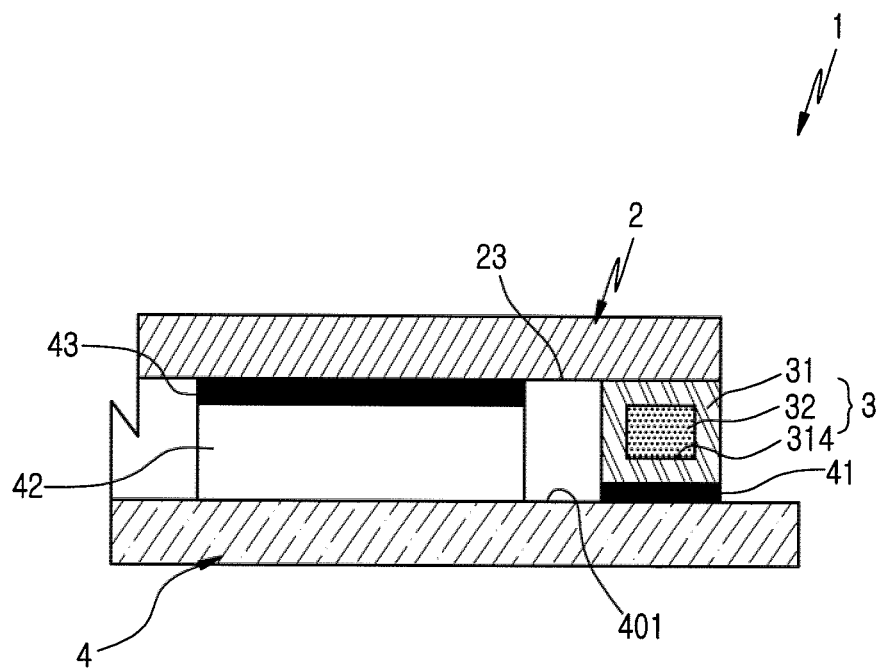
FIG. 5 illustrates a cross-sectional view for describing an assembled state of a shield can assembly according to various embodiments of the present disclosure.

FIG. 5 illustrates a cross-sectional view for describing an assembled state of a shield can assembly according to various embodiments of the present disclosure.

Referring to FIG. 5, a shield can assembly 1 includes a PCB 4 having a ground pad 41, a shield can 2 installed to be electrically connected with the ground pad 41 so as to shield an electronic component 42 mounted on the PCB 4, and a heat pipe 3 installed adjacent to the shield can 2 and dissipating heat generated from the electronic component 42 mounted on the PCB 4.

According to one embodiment, the heat pipe 3 is disposed on the top of the ground pad 41 installed on the top surface 401 of the PCB 4. According to one embodiment, the top portion of the heat pipe 3 is adhered to the shield can 2 using at least one of welding, fusion, bonding, and a conductive tape (that is, using welding, fusion, bonding, a conductive tape, or a combination thereof). According to one embodiment, when the heat pipe 3 is installed below the shield can 2 to serve as a side wall of the shield can 2 to shield the electronic component 42 mounted on the PCB 4, the shield can 2 is formed in a plate shape.

According to one embodiment, a heat dissipation pad 43 is installed on the top surface of the electronic component 42 of the PCB 4 to absorb the heat generated from the electronic component 42. According to one embodiment, the heat dissipation pad 43 is in close contact with an inner surface 23 of the shield can 2 so as to provide the heat absorbed from the electronic component 42 to the shield can 2. Accordingly, the heat generated from the electronic component 42 mounted on the PCB 4 is efficiently transferred to the shield can 2 through the heat dissipation pad 43. According to one embodiment, the heat absorbed from the shield can 2 moves to the frame 31 of the heat pipe 3 having a high heat conductivity, and the coolant 32 hermetically filled in the hollow portion 314 of the frame 31 may absorb and dissipate the heat of the frame 31. According to one embodiment, the coolant 32 dissipates the heat absorbed from the frame 31 to other mechanisms (such as, a magnesium bracket) through a vaporization and condensation process.

Figure 6:
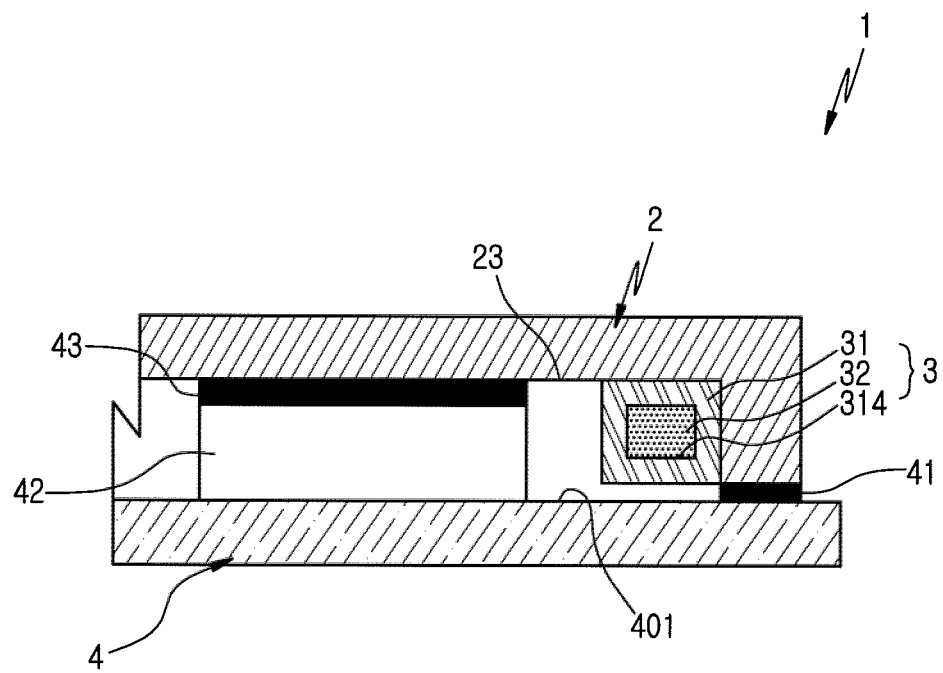
FIG. 6 illustrates a cross-sectional view for describing an assembled state of a shield can assembly according to various embodiments of the present disclosure.

FIG. 6 illustrates a cross-sectional view for describing an assembled state of a shield can assembly according to various embodiments of the present disclosure.

Referring to FIG. 6, a shield can assembly 1 includes a PCB 4 having a ground pad 41, a shield can 2 installed to be electrically connected with the ground pad 41 so as to shield an electronic component 42 mounted on the PCB 4, and a heat pipe 3 installed adjacent to the shield can 2 and dissipating heat generated from the electronic component 42 mounted on the PCB 4.

According to one embodiment, the shield can 2 is installed on the top of the ground pad 41 installed on the top surface 401 of the PCB 4.According to one embodiment, an inner surface 23 of the shield can 2 is adhered to the heat pipe 3 using at least one of welding, fusion, bonding, and a conductive tape. According to one embodiment, when the heat pipe 3 is fixed to an inner surface 23 of the can 2, the heat pipe 3 is space apart from the top surface 401 of the PCB 4.

According to one embodiment, a heat dissipation pad 43 is installed on the top surface of the electronic component 42 of the PCB 4 to absorb the heat generated from the electronic component 42. According to one embodiment, the heat dissipation pad 43 is in close contact with an inner surface 23 of the shield can 2 so as to provide the heat absorbed from the electronic component 42 to the shield can 2. Accordingly, the heat generated from the electronic component 42 mounted on the PCB 4 is efficiently transferred to the shield can 2 through the heat dissipation pad 43. According to one embodiment, the heat absorbed from the shield can 2 moves to the frame 31 of the heat pipe 3 having a high heat conductivity, and the coolant 32 hermetically filled in the hollow portion 314 of the frame 31 absorbs and dissipates the heat of the frame 31. According to one embodiment, the coolant 32 dissipates the heat absorbed from the frame 31 to other mechanisms (such as, a magnesium bracket) through a vaporization and condensation process.

Figure 7:
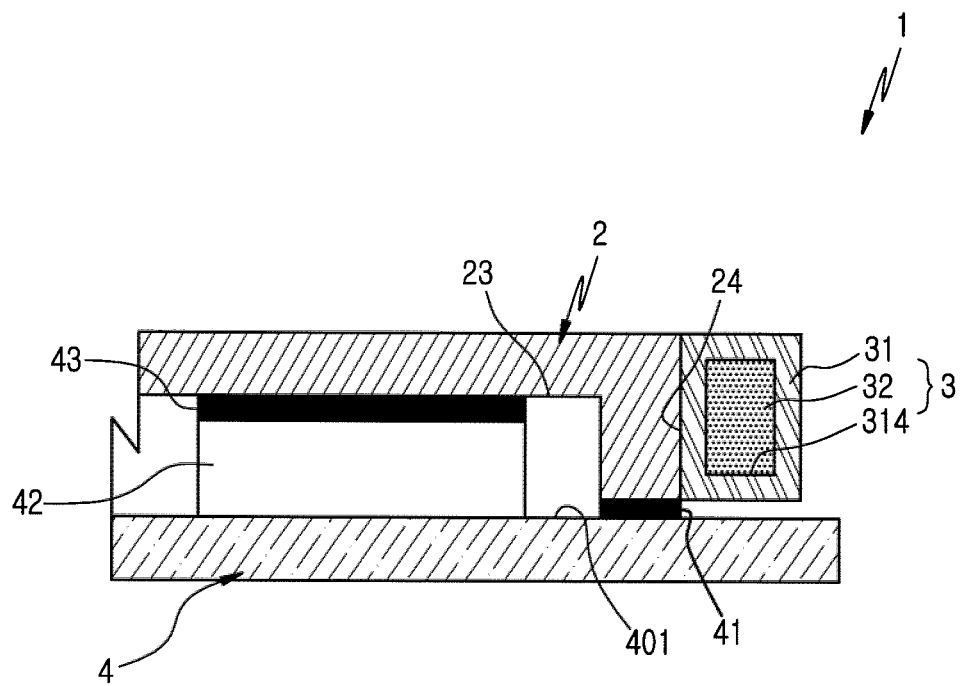
FIG. 7 illustrates a cross-sectional view for describing an assembled state of a shield can assembly according to various embodiments of the present disclosure.

FIG. 7 illustrates a cross-sectional view for describing an assembled state of a shield can assembly according to various embodiments of the present disclosure.

Referring to FIG. 7, a shield can assembly 1 includes a PCB 4 having a ground pad 41, a shield can 2 installed to be electrically connected with the ground pad 41 so as to shield an electronic component 42 mounted on the PCB 4, and a heat pipe 3 installed adjacent to the shield can 2 and dissipating heat generated from the electronic component 42 mounted on the PCB 4.

According to one embodiment, the shield can 2 is installed on the top of the ground pad 41 installed on the top surface 401 of the PCB 4. According to one embodiment, an outer surface 24 of the shield can 2 is adhered to the heat pipe 3 using at least one of welding, fusion, bonding, and a conductive tape. According to one embodiment, when the heat pipe 3 is fixed to an outer surface 24 of the can 2, the heat pipe 3 is space apart from the top surface 401 of the PCB 4.

According to one embodiment, a heat dissipation pad 43 is installed on the top surface of the electronic component 42 of the PCB 4 to absorb the heat generated from the electronic component 42. According to one embodiment, the heat dissipation pad 43 is in close contact with an inner surface 23 of the shield can 2 so as to provide the heat absorbed from the electronic component 42 to the shield can 2. Accordingly, the heat generated from the electronic component 42 mounted on the PCB 4 is efficiently transferred to the shield can 2 through the heat dissipation pad 43. According to one embodiment, the heat absorbed from the shield can 2 moves to the frame 31 of the heat pipe 3 having a high heat conductivity, and the coolant 32 hermetically filled in the hollow portion 314 of the frame 31 absorbs and dissipates the heat of the frame 31. According to one embodiment, the coolant 32 dissipates the heat absorbed from the frame 31 to other mechanisms (such as, a magnesium bracket) through a vaporization and condensation process.

Figure 8:
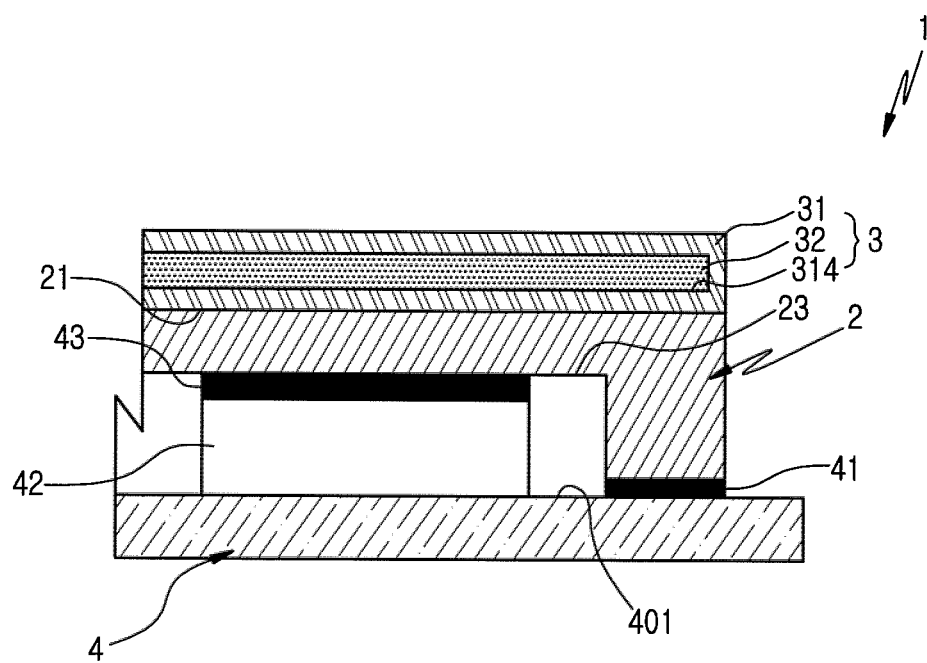
FIG. 8 illustrates a cross-sectional view for describing an assembled state of a shield can assembly according to various embodiments of the present disclosure.

FIG. 8 illustrates a cross-sectional view for describing an assembled state of a shield can assembly according to various embodiments of the present disclosure.

Referring to FIG. 8, a shield can assembly 1 includes a PCB 4 having a ground pad 41, a shield can 2 installed to be electrically connected with the ground pad 41 so as to shield an electronic component 42 mounted on the PCB 4, and a heat pipe 3 installed adjacent to the shield can 2 and dissipating heat generated from the electronic component 42 mounted on the PCB 4.

According to one embodiment, the shield can 2 is installed on the top of the ground pad 41 installed on the top surface 401 of the PCB 4. According to one embodiment, the top surface 21 of the shield can 2 is adhered to the heat pipe 3 using at least one of welding, fusion, bonding, and a conductive tape. According to one embodiment, the heat pipe 3 installed on the top surface 21 of the shield can 2 is formed in a plate shape rather than in a pipe structure.

According to one embodiment, a heat dissipation pad 43 is installed on the top surface of the electronic component 42 of the PCB 4 to absorb the heat generated from the electronic component 42. According to one embodiment, the heat dissipation pad 43 is in close contact with an inner surface 23 of the shield can 2 so as to provide the heat absorbed from the electronic component 42 to the shield can 2. Accordingly, the heat generated from the electronic component 42 mounted on the PCB 4 is efficiently transferred to the shield can 2 through the heat dissipation pad 43. According to one embodiment, the heat absorbed from the shield can 2 moves to the frame 31 of the heat pipe 3 having a high heat conductivity, and the coolant 32 hermetically filled in the hollow portion 314 of the frame 31 absorbs and dissipates the heat of the frame 31. According to one embodiment, the coolant 32 dissipates the heat absorbed from the frame 31 to other mechanisms (such as, a magnesium bracket) through a vaporization and condensation process.

According to various embodiments, in FIGS. 4 to 8, the heat pipe 3 is formed in a pipe structure having a rectangular cross-section. Without being limited thereto, however, the heat pipe 3 is formed in a pipe structure having a circular or polygonal cross-section.

Although particular embodiments have been described in the detailed description of the present disclosure, it will be apparent to those skilled in the art that various modifications and changes is made therein without departing from the scope of the present disclosure. Therefore, the scope of the present disclosure should not be defined as being limited to the embodiments, but should be defined by the appended claims and equivalents thereof.

What is claimed is:
1. An electronic device comprising:
a printed circuit board;
a ground pad disposed on a first area of the printed circuit board;
at least one electronic component disposed on a second area of the printed circuit board;
a shield can disposed on a top surface of the at least one electronic component; and
at least one heat pipe disposed between the printed circuit board and the shield can,
wherein the at least one heat pipe is configured as at least part of a side surface of the shield can and surrounds the at least one electronic component.

2. The electronic device of claim 1, further comprising:
a heat dissipation pad interposed between the shield can and the at least one electronic component.

3. The electronic device of claim 2, wherein the heat dissipation pad and the shield can are configured to draw away heat emitted from the at least one electronic component dissipate the drawn away heat to the heat pipe.

4. The electronic device of claim 1, wherein the heat pipe is adhered to the shield can by at least one of welding, fusion, bonding, or a conductive tape.

5. The electronic device of claim 1, wherein the heat pipe is fixed to an inner surface of the shield can.

6. The electronic device of claim 1, wherein the heat pipe includes a hollow frame; and a coolant hermetically filled in a hollow portion of the hollow frame, wherein the coolant dissipates heat emitted from the at least one electronic component through a vaporization and condensation process.

7. The electronic device of claim 6, wherein the hollow frame is formed in a size corresponding to a ground pad disposed on the printed circuit board.

8. The electronic device of claim 6, wherein the heat pipe is formed of at least one of aluminum, steel use stainless (SUS), and copper.

9. The electronic device of claim 1, wherein the heat pipe and the shield can are configured to form a side wall of the shield can.

10. A shield can comprising:
a top surface;
a side surface bent at a predetermined height along a border of the top surface; and
at least one heat pipe disposed between the side surface and a printed circuit board,
wherein the shield can is disposed on a top surface of at least one electronic component on the printed circuit board, and
wherein the at least one heat pipe is configured as a least part of the side surface of the shield can and surrounds the at least one electronic component.

11. The shield can of claim 10, wherein the at least one heat pipe is fixed to a part of at least one of an inner surface or an outer surface of the shield can.

12. The shield can of claim 11, wherein the heat pipe is adhered to the at least one of an inner surface or an outer surface of the shield can by at least one of welding, fusion, bonding, or a conductive tape.

13. The shield can of claim 10, wherein the heat pipe includes a hollow frame; and a coolant hermetically filled in a hollow portion of the hollow frame, wherein the coolant dissipates heat emitted from an electronic component through a vaporization and condensation process.

14. The shield can of claim 13, wherein the hollow frame is dimensioned to couple to a ground pad disposed on the printed circuit board.

15. The shield can of claim 13, wherein the heat pipe is formed of at least one of aluminum, steel use stainless (SUS), and copper.

16. The shield can of claim 10, wherein the heat pipe and the side surface of the shield can are configured to form a side wall of the shield can.

* * * * *